United States Patent
Escudero

Patent Number: 5,859,769
Date of Patent: Jan. 12, 1999

[54] PILOTING SYSTEM FOR ELECTRIC INVERTER

[75] Inventor: Jose Escudero, Mostolez, Spain

[73] Assignee: Antonio Merloni S.p.A., Fabriano, Italy

[21] Appl. No.: 680,105

[22] Filed: Jul. 15, 1996

Related U.S. Application Data

[63] Continuation of Ser. No. 251,698, May 31, 1994, abandoned.

[30] Foreign Application Priority Data

May 31, 1993 [IT] Italy .......................... BO93 A 000249

[51] Int. Cl.$^6$ .................................................. H02H 7/122
[52] U.S. Cl. ................................ 363/58; 363/40; 363/96; 363/98; 363/132; 363/136
[58] Field of Search .................................. 363/17, 39, 40, 363/58, 98, 96, 132, 136, 137, 138

[56] References Cited

U.S. PATENT DOCUMENTS

| | | | |
|---|---|---|---|
| 4,122,515 | 10/1978 | Tachibana et al. | 363/45 |
| 4,270,163 | 5/1981 | Baker | 363/43 |
| 4,686,618 | 8/1987 | McMurray | 363/58 |
| 4,881,159 | 11/1989 | Holtz et al. | 363/58 |
| 4,926,306 | 5/1990 | Ueda et al. | 363/58 |
| 4,967,100 | 10/1990 | Okutsu et al. | 307/270 |
| 5,383,109 | 1/1995 | Okayama | 363/137 |

*Primary Examiner*—Peter S. Wong
*Assistant Examiner*—Shawn Riley
*Attorney, Agent, or Firm*—Herbert Dubno

[57] ABSTRACT

The MOSFETs or IGBTs of respective arms of an electronic inverter are in series with SCRs or TRIACs triggered into conduction during intervals of intended conduction of the respective MOSFETs or IGBTs connected to the high level rectifier terminal. The piloting of the SCRs or TRIACs is effected from the piloting of the MOSFETs or with delay or in a conditional manner. The circuit eliminates the effective transience on the inverter output.

7 Claims, 6 Drawing Sheets

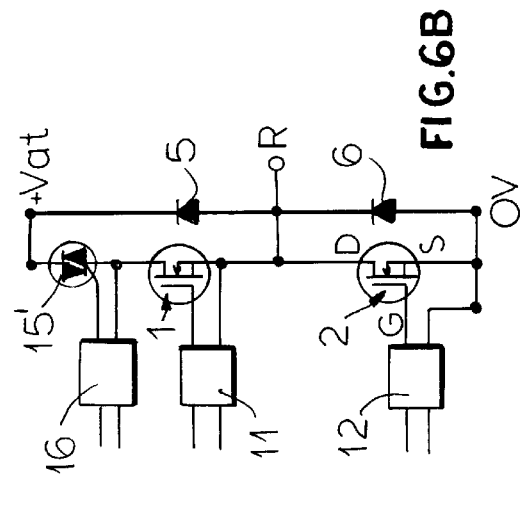
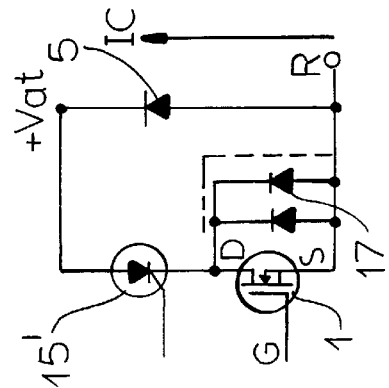
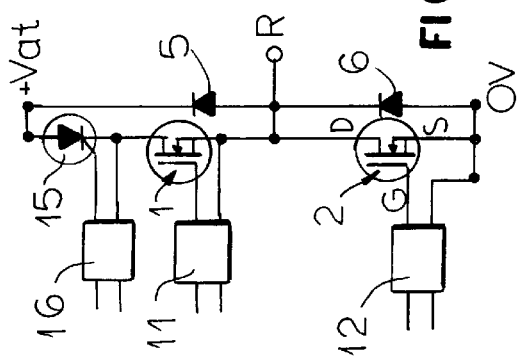
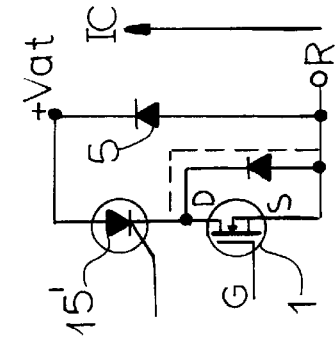
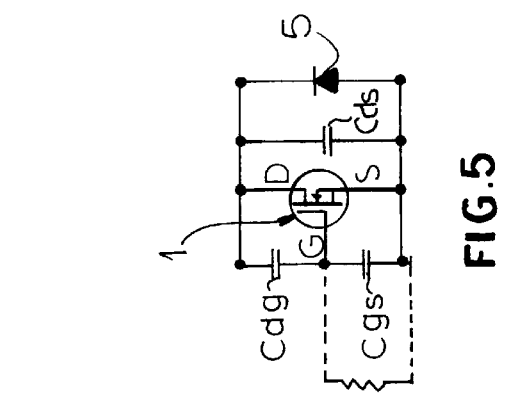
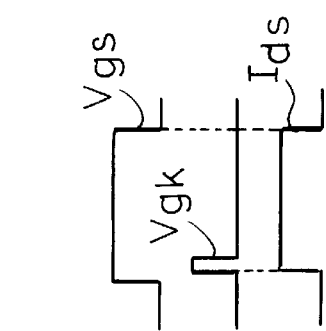

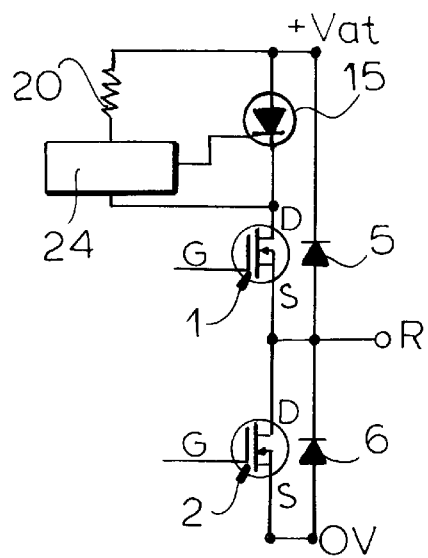
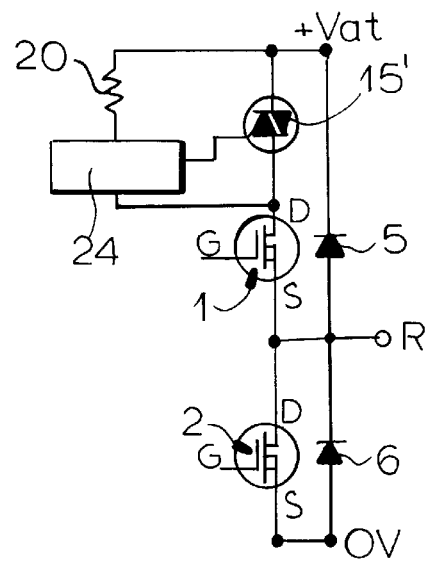
FIG.13A  FIG.13B
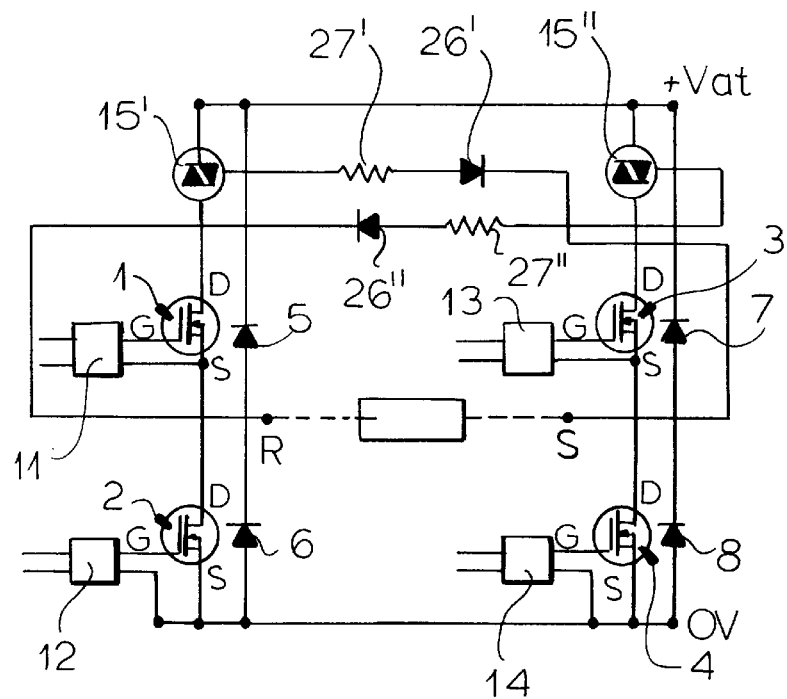
FIG.14

PILOTING SYSTEM FOR ELECTRIC INVERTER

CROSS REFERENCE TO RELATED APPLICATION

This is a file-wrapper continuation of application Ser. No. 08/251,698 filed 31 May, 1994 now abandoned.

FIELD OF THE INVENTION

The present invention relates to a piloting system for an electronic inverter and, more particularly, to an electronic inverter utilizing a bridge network of source-gate-drain semiconductors, especially field effect transistors and particularly MOSFETs or IGBTS, with improved piloting circuitry.

BACKGROUND OF THE INVENTION

Speed control in a synchronous electronic motors with alternating monophase and polyphase current used in modern equipment and automation is effected by varying the frequency of the supplied current. This variation can be obtained by inverters which are capable of converting the network voltage having a stable frequency (usually 50 Hz or 60 Hz), into a voltage with a continuously variable frequency which can range for example, from one Hz to several hundred Hz.

Conventional inverters for this purpose used silicon controlled rectifiers (SCRS) which, however, have the problem that they are highly sensitive to transients in the network supply or generated in the inversion operation and which can cause destruction of fuses or overloads.

To avoid this problem, power transistors with analog modes of operation were substituted for the on/off switches constituted by SCRs.

More recently, inverters, especially in large scale integration (LSI), have been provided with MOSFET transistors or IGBT transistors and significantly differ from the previous SCRs or power transistors in that they are devices which control the voltage rather than the current as characterized prior power transistors and the like. The MOSFETS (Metal Oxide Semiconductor Filed Effect Transistors) and IGBTs (Insulated Gate Bipolar Transistors) are field effect transistors which have source, drain and gate terminals and which can be used to control significant power with a minimum gate power. These devices can be considered to consist of two diodes having a common cathode or anode.

Experience with MOSFETS, for example, in inverter circuits has shown that the MOSFETS are incapable of eliminating the problem of undesired switching due to transient parasitic voltages in the network with the danger that the electronic components will burn out, or the fuses will open circuit.

In order to supply a given load with a variable frequency f with the availability of only one direct current voltage generator V, it is sufficient to switch the flow of current in the load with the frequency f.

This commutation or switching must be performed with strictly constant time intervals so that the positive half wave and the main value of the alternating current circulating in the load has a value of zero. For this purpose, the inverter can be formed as a bridge circuit with at least two arms (two arms in the case of a single phase inverter and three arms in the case of a three phase inverter), each arm having two switches in respective halves of the arm of the bridge circuit. The output terminals are connected between the switches of the arms to the load and the arms are bridged between the direct current terminals of a rectifier network.

A simultaneous closing of the two switches in the same arm causes a short circuit of the power supply through the MOSFETs or IGBTs and/or the protective fuses or other components in the short circuit path.

When the MOSFETs or IGBTs are used, they constitute the switches in the aforementioned arms and the conventional inverter circuit will normally include a rectifier capacitor network producing the direct current output from the alternating current of the supply network, diodes for energy recovery and serving to protect the MOSFETs against destructive transient voltage surges, a control unit for sequencing the MOSFETs and any power supply required for the control unit.

It is important in the piloting of MOSFET transistors that the respective piloting circuits of the MOSFETs of a particular arm not have any common line as long as the drains of the MOSFETs are at different voltage levels.

One of the problems in dealing with inverters with MOSFET power transistors is false piloting signals due to transients which are invariably present in the supply network or generated in the load.

The transients occurring in other parts of the circuit, usually at capacitive components thereof, can be transmitted to the gate of the MOSFET setting it into conduction when it should be nonconductive, thereby detrimentally affecting the conducting pattern of the circuit. Generally, the source-drain diode component of the MOSFET does not interfere with the filing sequence since it is a fast diode.

To solve the problems with MOSFET invertors as described it has hitherto been required to provide complex pilot circuitry which frequently can cost 10 times the cost of the MOSFET to be controlled.

OBJECTS OF THE INVENTION

It is therefore an object of the present invention to provide an improved control system for a MOSFET or IGBT inverter whereby the drawbacks outlined above are avoided.

Another object of this invention is to provide an electronic inverter utilizing MOSFETs or IGBTs, whereby at a comparatively low cost and with high efficiency, false energization of the MOSFETs by transients can be eliminated or minimized.

It is also an object of this invention to provide an improved electronic inverter which avoids drawbacks of earlier inverters, especially those utilizing MOSFETs or IGBTs.

SUMMARY OF THE INVENTION

These objects and others which will become apparent hereinafter are attained, in accordance with the invention, in an electronic inverter which comprises:

a rectifying network having an alternating current input and direct current output;

a plurality of arms connected across the direct current output and including two field effect transistors having source, drain and gate terminals, the source and drain terminals of the two field effect transistors of each arm being connected in series, each arm having an output terminal connected to an alternating current load;

timing means connected to the gates of the field effect transistors for cyclically rendering alternating ones of the field effect transistors of each arm conductive, thereby energizing the load with alternating current;

a respective protective diode bridged across each of the field effect transistors;

a respective gate-triggerable current control element in series with one of the field effect transistors of each of the arms and a respective terminal of the direct current output, and assigned to the respective field effect transistor; and piloting circuitry for the gate-triggerable current control elements for triggering the current control elements into conductivity cyclically only during required intervals of conductivity of the field effect transistors to which the current control elements are assigned.

According to a feature of the invention, the piloting circuitry for the SCRs or TRIACs is coupled with the timing means for triggering the current control elements in response to initiation of conductivity of effective field effect transistors which can be a MOSFET or IGBT.

Alternatively, the piloting circuitry can respond to initiating of conductivity of the respective field effect transistor with a delay.

In still another alternative, referred to herein as conditional control, the piloting circuitry includes conditional triggering means preventing triggering of the current control element assigned to one field effect transistor of one arm when a field effect transistor of another arm assigned to another control element is conductive.

To prevent false triggering of the current control elements, i.e. the gate of the SCR or TRIAC, the piloting circuitry can be designed to require a substantial triggering potential.

The current control elements can be located between a positive terminal of the direct current output and the respective MOSFET or IGBT, i.e. between the so-called upper MOSFET or IGBT and the high level output of the rectifier/capacitor network.

The principle of operation of the invention is, of course, very simple. In each arm of the bridge constituting the inverter, in series with the two MOSFET transistors forming the arm, between the supply source +Vat and the upper MOSFET, an additional current controlling device is provided which can be an SCR or TRIAC. By means of suitable circuity, the triggering of the supplemental control device takes place only when the triggering of the upper MOSFET of the arm is also intended and which otherwise could not occur since triggering would not be possible because that MOSFET is not directly connected to +Vat. Given the fact that an SCR or TRIAC requires significant piloting power by comparison to that required to trigger a MOSFET or IGBT, the danger of false triggering of the upper MOSFET is prevented when the piloting logic of the inverter does not intend such triggering.

BRIEF DESCRIPTION OF THE DRAWING

The above and other objects, features, and advantages will become more readily apparent from the following description, reference being made to the accompanying drawing in which:

FIG. 5 is an equivalent circuit for a MOSFET, used in an explanation of the principles of this invention;

FIGS. 6A and 6B are circuit diagrams for arms of the inverter modified in accordance with the invention to include an SCR and a TRIAC, respectively;

FIG. 7 is a wave form diagram representing the signals applied to the gate of the MOSFET to the SCR in, for example, the circuit of FIG. 6A;

FIGS. 8A and 8B are equivalent circuits showing the creation of a reverse current to provide a protective voltage barrier preventing transient operation of the MOSFETS in an inverter operator according to the invention, the circuit of FIG. 8B having an external diode in addition;

FIGS. 13A and 13B are details of the circuits of FIGS. 12A and 12B respectively; and FIG. 14 is a circuit diagram of a monophase inverter preventing the false triggering of TRIACS protecting the arms of a bridge.

SPECIFIC DESCRIPTION

Figure 1:
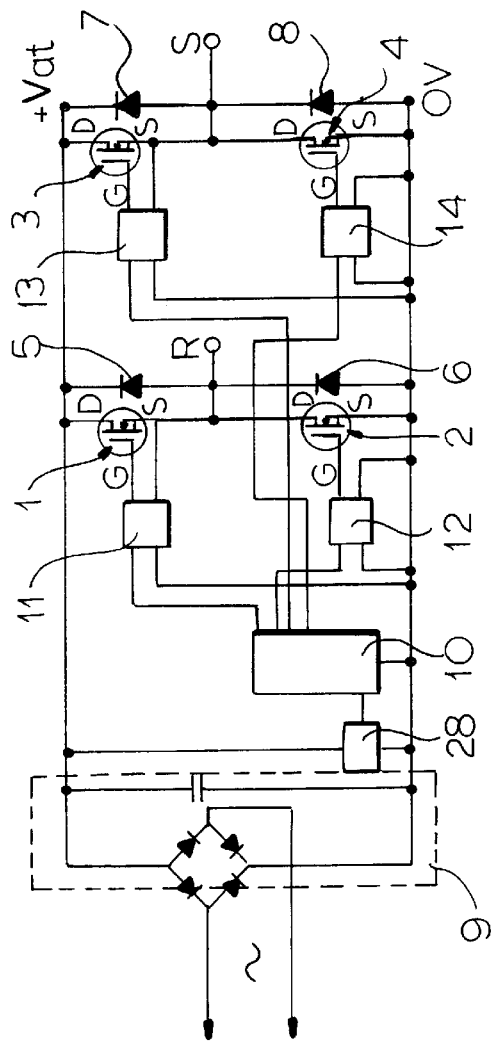
FIG. 1 is a diagram of a prior art electronic inverter using MOSFETs and in which the outputs of the controller for the timing of the MOSFETs are shown connected to the MOSFET control circuits, in a single phase system.
Figure 2:
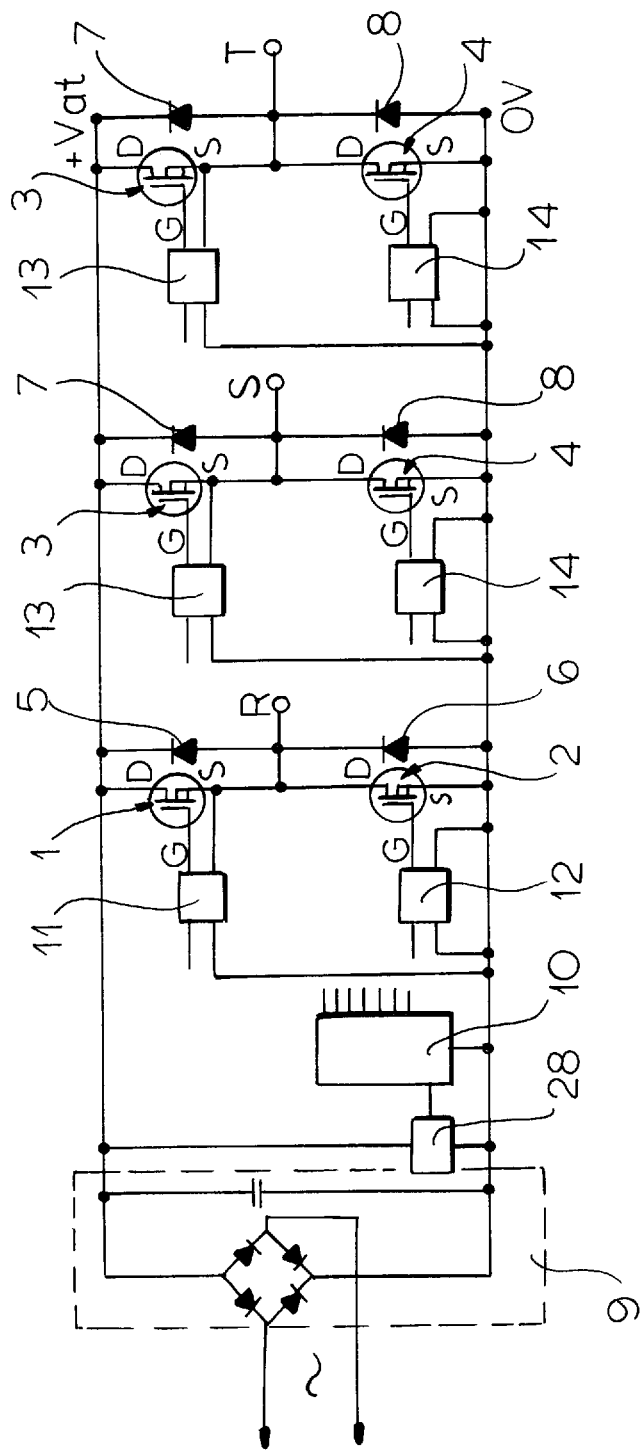
FIG. 2 is a view similar to FIG. 1 having a three-phase inverter but wherein, for simplicity, the outputs of the timing circuits have not been connected to the individual MOSFET control circuits.

FIGS. 1 and 2 show prior art inverter circuits for a single phase load and a three-phase load, respectively. The load is connected to output terminals RS of the bridge circuits or R, S, T, respectively. The single phase circuit of FIG. 1 comprises two bridge arms with MOSFETs or IGBTs 1, 2, 3, 4, respectively, having their source-drain paths in series, the output terminals R, S, or R, S, T being tapped between the two MOSFETs or IGBTs of the respective arms. Bridged across the switches 1, 2, 3, 4 are respective energy recovering diodes 5, 6, 7, 8 serving for protection of the MOSFETs or IGBTs from transient voltage surges in the inverse direction. The circuits include rectifier-condenser filtered rectifying networks 9 which are connected to the monophase or polyphase alternating current network and transform thereof into direct current at a voltage which at its high terminal +Vat is positive with respect to its low terminal referred to +Vat as 0 V.

A controlled unit 10 determines the sequence of triggering and shutdown of the MOSFET transistors forming the inverter. The MOSFET transistors 1, 2, 3, 4 have respective piloting units 11, 12, 13, 14 which are conventional and form the requisite signals for controlling the MOSFETS 1, 2, 3, 4 in response to the signals from block 10.

From the voltage supply +Vat, a supply source 28 supplies the operating direct voltage Vcc for the operation of the control and piloting circuits.

The principle of operation of the inverter of FIG. 1 or FIG. 2 will be apparent and is conventional, MOSFETs 1 and 4 being conductive simultaneously for half of each alternating current phase for the output current through the load while the MOSFETs 3 and 2 are conductive during the other half cycle, the switching cadence determining the frequency of the cycles and hence the speed of the motor connected across the load terminals RS and RST, respectively.

Figure 4B:
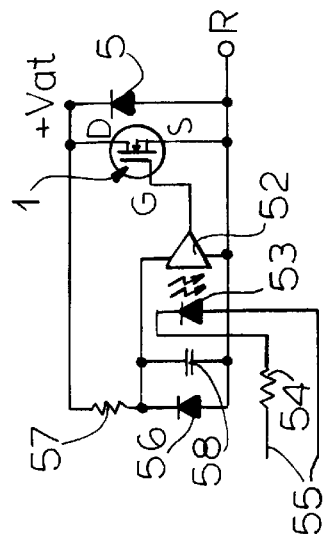
FIGS. 4A and 4B are circuit diagrams illustrating the isolation of the timing circuits for the MOSFETS.
Figure 4A:
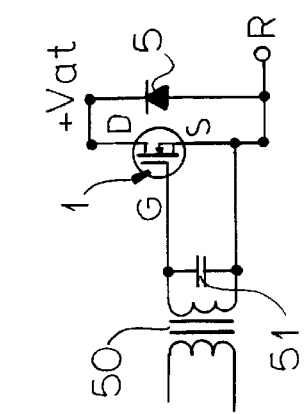
Figure 3:
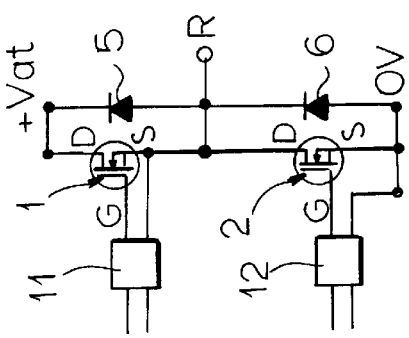
FIG. 3 is a detail of one arm of the MOSFET bridge as used in the circuits of FIGS. 1 and 2 serving for explanation of the problems solved by the invention.

FIG. 3 shows that the two piloting circuits 11 and 12 for the MOSFETS 1 and 2 constituting a respective arm have no common line since the two drains are at two different voltage levels. The piloting voltages for the MOSFETs have to be isolated with, for example, isolation circuitry as shown in FIGS. 4A and 4B. In FIG. 4A, the isolation circuit comprises a transformer 50 whose primary winding is connected to the triggering circuit 10 and whose secondary circuit, bridged by a condenser 51 is connected across the gate and source terminals of the MOSFET 1.

In FIG. 4B, an optoelectronic isolator is provided.

Here an amplifier 52, such as a triode sensitive to a light signal is juxtaposed with a light emitting diode 53 receiving its input from the timing circuit 10 via a resister 54 at the input terminals 55. The amplifier 52 may be bridged by a diode 56 in series with a resistor 57 and bridged by a capacitor 58.

The MOSFET transistors of each arm are controlled by the timing circuit 10 so as to be in conduction alternating without any phase of simultaneous conduction no matter how short, since even a brief period of simultaneous conduction would result in a short circuit between +Vat and 0 V, destroying the MOSFET transistors.

As can be seen from FIG. 5, an equivalent circuit of the MOSFET shows capacitive elements Cdg, Cgs and Cds representing the capacitances between the drain and gate, between the gate and the source and between the drain and source respectively. The resistance Rd represents the internal resistance of the pilot circuit 11. Because of the presence of these capacitative components inherent to the MOSFET, transients can trigger the MOSFET.

In FIGS. 6A and 6B I show the modification of the circuit of FIG. 1 or FIG. 2 for a single arm of the respective bridge. The modification is intended to eliminate the danger of simultaneous conduction of two MOSFETs of the same arm. In the circuit of FIG. 6A an SCR 15 is connected between the drain of the upper MOSFET 1 and the high voltage terminal of the DC power supply, namely +Vat, the gate of this SCR being triggered by pilot circuitry 16.

In FIG. 6B, a TRIAC 15' is provided between the upper MOSFET 1 and +Vat.

In other to trigger the SCR or TRIAC from a blocking (nonconductive) state into conduction, normally a voltage pulse between 5 and 10 volts is required with a current 10 ma is required between the gate and cathode.

As can be seen from FIG. 7, prior to triggering of the SCR or TRIAC, a signal Vgs (FIG. 7) must be applied between the gate and source of the MOSFET, immediately followed by the application of the signal Vgk between the gate and cathode of the SCR 15 or the TRIAC 15', thereby causing a current Ids to pass in the drain source path from +vat to the terminal R of the land. For the effect of the signal Vgs, the inherent resistance Rdon of the MOSFET 1 between drain and source decreases from infinite to an extremely low value of the milliohm range.

During shutdown of the SCR 15 or TRIAC 15', when the pilot circuit 16 no longer sends the signal Vgs which becomes zero or negative, the resistance between drain and source again becomes infinite and current flow through a MOSFET 1 is interrupted. The interruption of the current flow through the MOSFET also terminates current flows through the SCR or TRIAC thereby quenching same. Protection of the MOSFET against undue triggering is thereby restored.

FIG. 8A shows how a low reverse current Irec can circulate through the inherent diode Dsd of MOSFET 1, this current being required for recreating the potential barrier in the SCR 15 or TRIAC 15' and has been shown for the TRIAC 15'. If the reverse current is considered potentially dangerous for the MOSFET, an external diode 17 can be provided (FIG. 8B) in parallel with the intrinsic diode Dsd of the MOSFET.

The diode 5, of course, represents a by-pass diode provided for inductive loads supplied by the inverter.

Figure 9B:
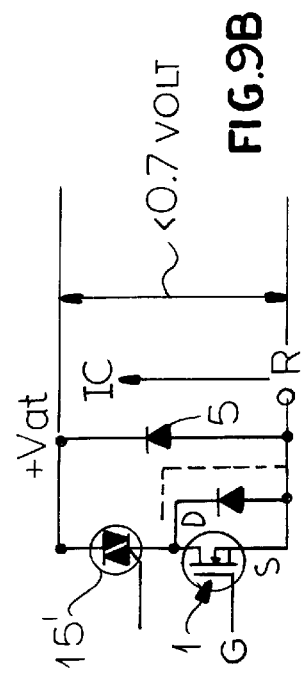
FIGS. 9A and 9B are diagrams illustrating the conditions of shutdown of the TRIAC when the voltage thereacross falls to one volt.
Figure 9A:
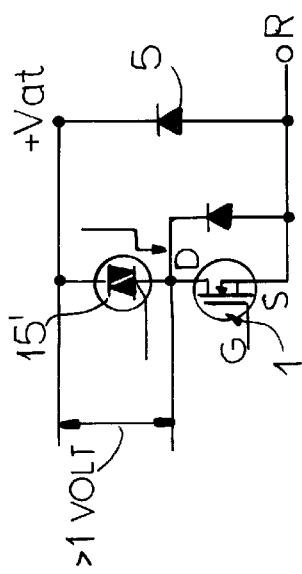

In the recirculation phase of the reverse current due to an inductive load the voltage decrease between the anode and cathode of diode 5 is a maximum of 0.7 volt. Because the TRIAC 15' in conjunction has a voltage decrease of more than one volt, shutdown of TRIAC 15' is insured (see FIGS. 9A and 9B).

Three different methods can be used in accordance with the invention in piloting the TRIAC or SCR. These are:
 triggering by means of the piloting unit for the MOSFET;
 delayed triggering;
 conditional triggering.

Figure 10B:
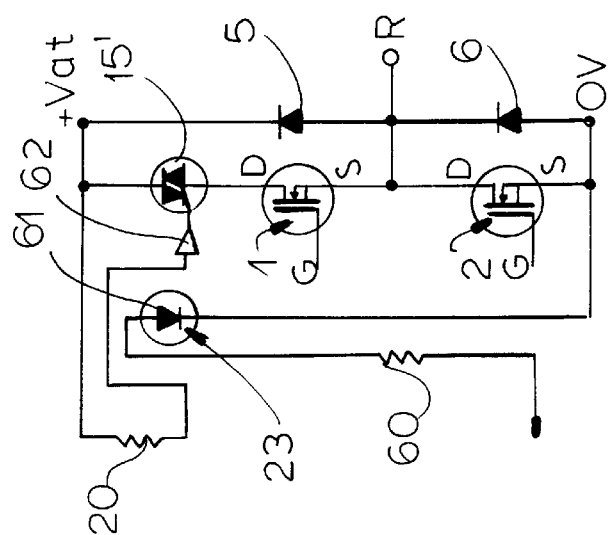
FIGS. 10A and 10B are circuit diagrams showing SCR and TRIAC protective elements in optoelectronic isolated circuits according to the invention.
Figure 10A:
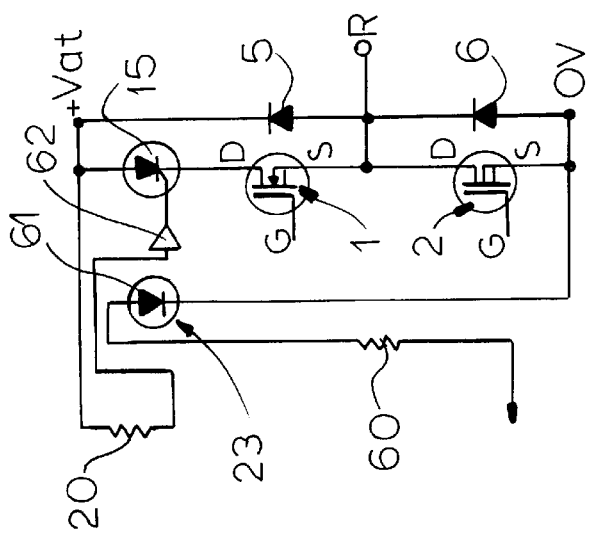

For triggering by means of the piloting unit of the MOSFET, reference may be had to FIGS. 10A and 10B.

Figure 12A:
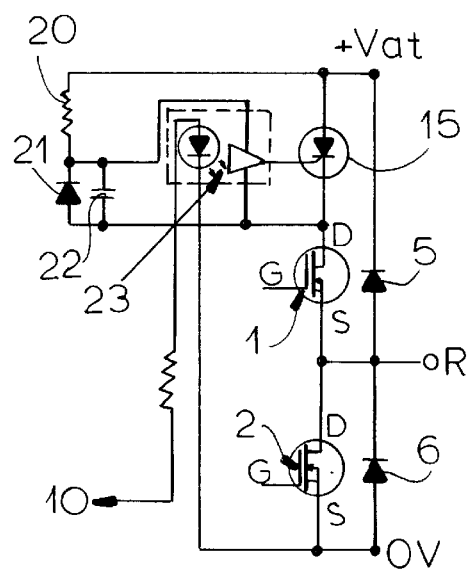
FIGS. 12A and 12B represent circuits utilizing SCR and TRIAC protective elements, respectively, with optoelectronic coupling.
Figure 12B:
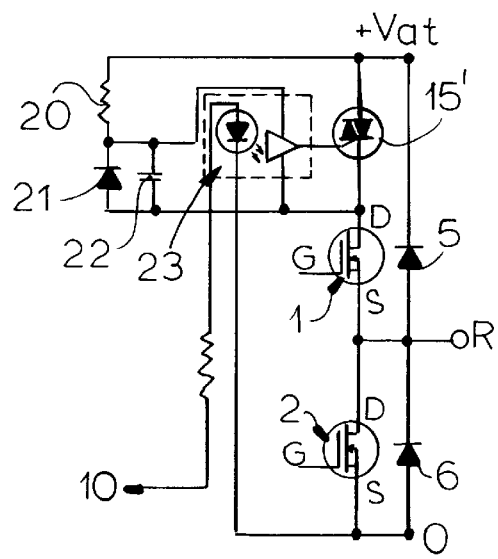

Here the signal from the timing circuit of the MOSFET is applied via a resistor 60 to a light emitting diode 61 which can trigger the circuit 62 as is conventional in optoelectronic isolators. The unit 62, of course, triggers the SCR 15 or the TRIAC 15'. A resistor 20 is connected across the optoamplifier 62. FIGS. 12A and 12B show another form of optoelectronic coupling.

Figure 11A:
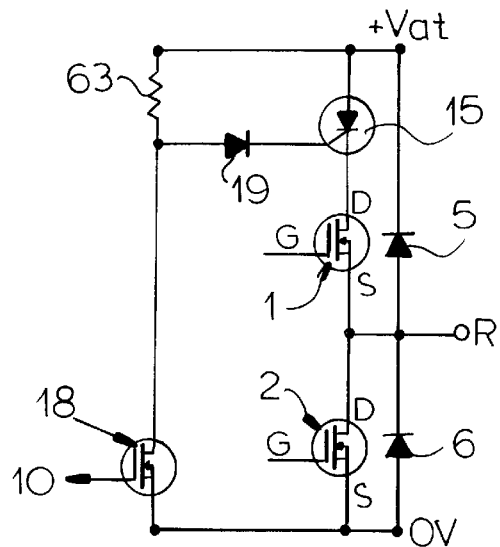
FIGS. 11A and 11B are circuits for SCR and TRIAC protective systems according to the invention utilizing direct coupling via voltage dividers.
Figure 11B:
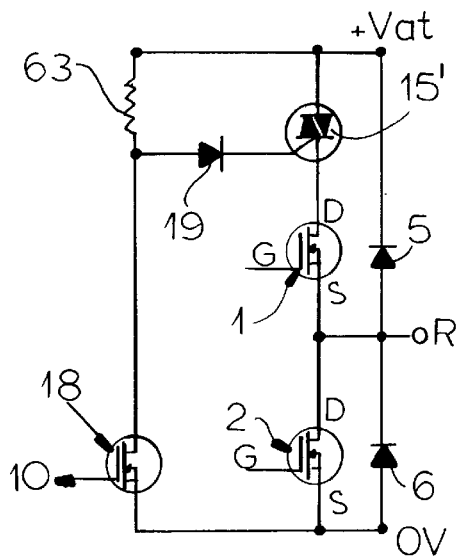

For triggering of the SCR or TRIAC by the timing unit of the MOSFET, three different types of coupling between the pilot 11 and the gate of SCR 15 or TRIAC 15' can be provided. Direct coupling can be effected by means of a voltage divider consisting of the resistor 63 and a transistor 18 through a diode 19 when the resistor 18 is conductive, the diode 19 is connected to 0 V and the SCR or TRIAC cannot be triggered. When transistor 18 is blocked, however, the gate 15 is triggered by +Vat through resistor 18 and diode 19 (FIGS. 11A and 11B). Magnetic coupling can be used utilizing a transformer circuit as shown in FIG. 4A.

The optoelectronic coupling has already been described. The modification shown in FIGS. 12A and 12B, including the resistor 20 in series with the zener diode 21 allows the voltage across the zener to load a condenser 22 and feed the optoelectronic emitter, namely, the LED 23 which triggers the SCR 15 or TRIAC 15' into conduction.

The current lagging in the bridge 20, 21 and 22 is negligible. False triggering of MOSFET due to a transient will not produce any damage to the other MOSFET in the arm of the bridge.

The circuits of FIGS. 13A and 13B insure delayed triggering. The gate of the SCR 15 or TRIAC 15' is piloted by a relaxation oscillator 24 supplied from +Vat through resistor 20. The oscillator however functions only when the MOSFET 1 is triggered which can occur in the presence of transients. Once supplied with power, however, the oscillator will generate pulses capable of triggering the SCR or TRIAC only after the lapse of time interval Tr which is long by comparison with the average duration of the transient.

The relaxation oscillator can be based upon a DIAC, UCT or equivalent circuit. FIG. 14 shows a circuit for conditional triggering and applicable to a monophase inverter, utilizing a connection which hinders the triggering of a TRIAC 15' or 15" for one branch when the upper MOSFET of the other bridge arm is conductive.

The inverter functions only when the MOSFETs 1 and 4 or 3 and 2 are automatically rendered conductive. The MOSFET 4 is rendered conductive by the signal pilot 14 with the terminal S at zero volt. Through a diode 26' and a resistance 27' the gate of the TRIAC 15' (whose cathode is connected to +Vat) is reached by a current which does not cause triggering. Only when the higher voltage required for triggering is applied does the TRIAC become conductive.

I claim:

1. An electronic inverter, comprising:

a rectifying network having an alternating current input and direct current output;

a plurality of arms connected across said direct current output and including two field effect transistors having source, drain and gate terminals, the source and drain terminals of the two field effect transistors of each arm being connected in series, each arm having an output terminal connected to an alternating inductive current load in the form of an electric motor;

timing means connected to the gates of said field effect transistors for cyclically rendering alternating ones of said field effect transistors of each arm conductive, thereby energizing said load with alternating current;

a respective protective diode bridged across each of said field effect transistors;

a respective gate-triggerable current control element selected from a triac and an SCR in series with one of the field effect transistors of each of said arms and a respective terminal of said direct current output, and assigned to the respective field effect transistor; and piloting circuitry for said gate-triggerable current control elements for triggering the current control elements into conductivity cyclically only during required intervals of conductivity of the field effect transistors to which the current control elements are assigned, said piloting circuitry responding to initiation of conductivity of the respective field effect transistor with a delay.

2. The inverter defined in claim 1 wherein said piloting circuitry requires a certain triggering potential above preventing false triggering of said current control elements by voltage transients.

3. The inverter defined in claim 1 wherein said field effect transistors are insulated gate bipolar transistors.

4. The inverter defined in claim 1 wherein said current control elements are metal oxide semiconductor field effect transistors.

5. The inverter defined in claim 4 wherein said current control elements are located between a positive terminal of said direct current output and the respective metal oxide semiconductor field effect transistor.

6. The inverter defined in claim 5 wherein each of said current control elements is a silicon controlled rectifier.

7. The inverter defined in claim 5 wherein each of said current control elements is a TRIAC.

* * * * *